United States Patent [19]

Bader

[11] Patent Number: 5,079,517
[45] Date of Patent: Jan. 7, 1992

[54] CIRCUIT FOR DC CONTROL OF A COMPRESSOR

[75] Inventor: Scott K. Bader, Mesa, Ariz.

[73] Assignee: Motorola, Inc., Schaumburg, Ill.

[21] Appl. No.: 650,150

[22] Filed: Feb. 4, 1991

[51] Int. Cl.⁵ .............................................. H03G 3/30
[52] U.S. Cl. ..................................... 330/285; 330/85; 330/140
[58] Field of Search ................. 330/85, 140, 252, 274, 330/285, 296; 333/14

[56] References Cited

U.S. PATENT DOCUMENTS 3,919,654 11/1975 Toumani .......................... 330/85 X Primary Examiner—Steven Mottola
Attorney, Agent, or Firm—Bradley J. Botsch; Michael D. Bingham

[57] ABSTRACT

A compressor with a DC bias control circuit is provided. The DC bias control circuit provides a predetermined DC current to a variable gain stage of the compressor circuit such that when the input signal to the compressor is substantially equal to zero, the variable gain stage is biased by the DC current and provides a DC feedback path for the compressor.

16 Claims, 1 Drawing Sheet

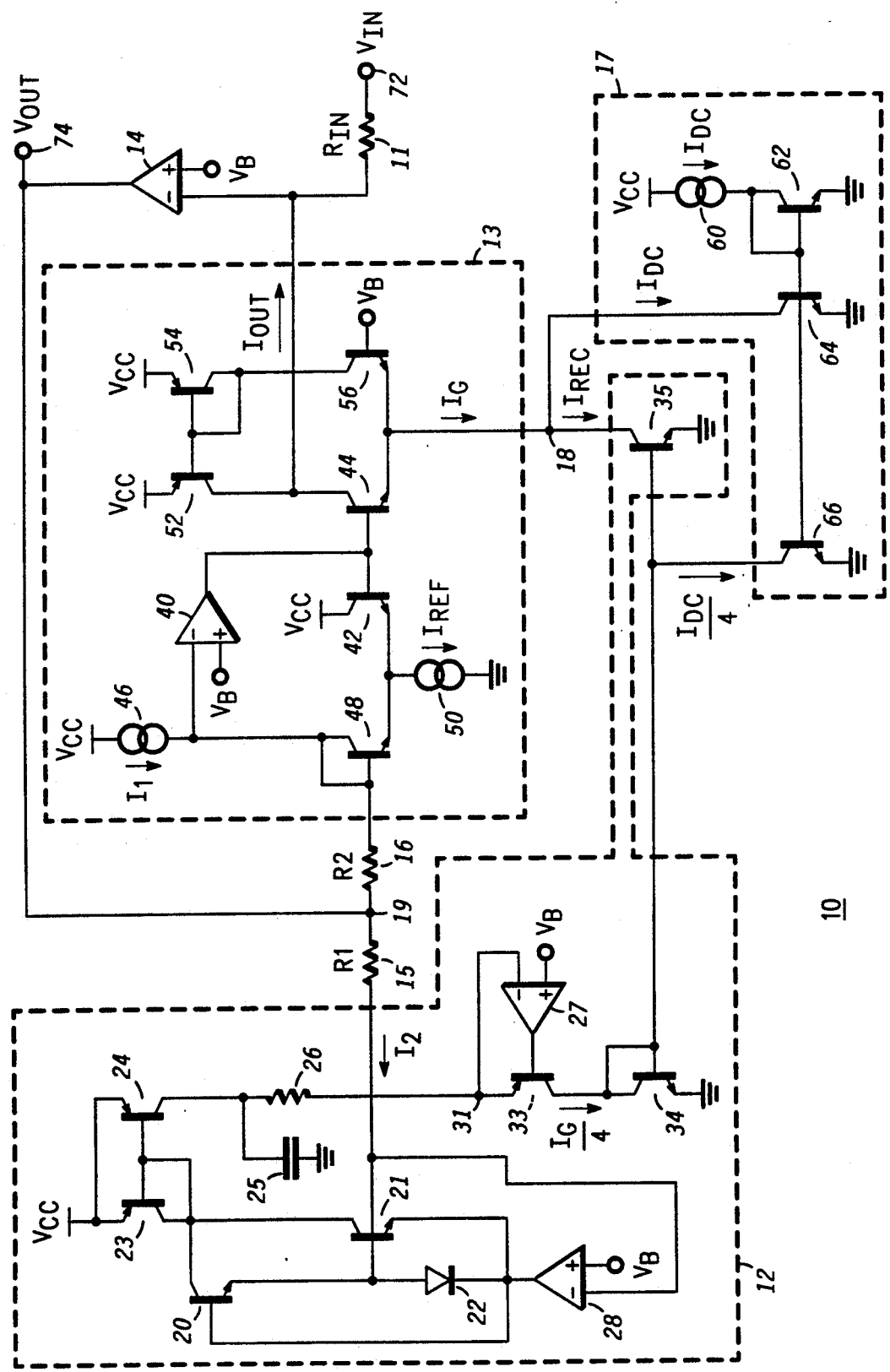

CIRCUIT FOR DC CONTROL OF A COMPRESSOR

BACKGROUND OF THE INVENTION

This invention relates to compandors, for example, a circuit for providing DC bias control of a compressor.

Companding is a widely used technique for gaining a signal to noise ratio improvement in systems where a signal is passed through a noisy transmission medium. Companding is utilized when one wishes to transmit a signal with a large dynamic range through a channel that has limited dynamic range. The process of companding is a method whereby data with a large dynamic range is first "compressed" thereby attenuating the high voltage signals and amplifying the low voltage signals. This compressed limited dynamic range signal is then usually transmitted over a channel. Upon receipt, the data is "expanded" thereby amplifying the high voltage signals and attenuating the low voltage signals.

The basic building blocks of a compandor are an operational amplifier (op amp), a rectification and average circuit, and a variable gain stage. The op amp is typically connected in a negative feedback mode whereby the rectification and average circuit and the variable gain stage are configured in the feedback loop for a compressor or connected to the inverting input of the op amp for an expander.

The rectification and average circuit performs rectification of the input signal, for the expander, or of the output signal, for the compressor, and then averages the rectified signal to obtain a DC signal that is proportional to the average level of the input or output signal for a expander or compressor, respectively. This DC signal then feeds the variable gain stage which determines the overall gain of the compandor. Additionally, the gains of a compressor and an expander are typically complimentary wherein the output of the former is a function of the square root of the input signal, while the output of the latter is a function of the square of the input signal.

With respect to a compressor, a variable resistor is utilized in the feedback path and the variable resistor is typically infinite when no input signal is present. As a result, a separate DC feedback path is required to properly bias the compressor in the absence of an input signal.

One approach to bias the compressor when there is no input signal present is described in an article by Craig C. Todd entitled "A Monolithic Analog Compandor", IEEE JSSC vol. sc-11. In particular, the subject compandor includes a separate DC feedback path comprised of external resistors and an external capacitor. However, in addition to requiring these three additional components, two additional pins are also required which may not be suitable on an 8-pin integrated circuit or any pin limited application.

Hence, a need exists for a circuit that provides DC bias control of a compressor in the absence of an input signal which minimizes the number of external components and pins required.

SUMMARY OF THE INVENTION

Briefly, there is provided a circuit responsive to an input signal applied at an input and providing an output signal at an output comprising an operational amplifier circuit having first and second inputs and an output, the first input being coupled to receive a bias voltage, the second input being coupled to the input of the circuit, and the output of the operational amplifier circuit being coupled to the output of the circuit; a rectification and average circuit for providing a DC signal at an output of the rectification and average circuit in response to the output signal, the rectification and average circuit having an input coupled to the output of the circuit; a variable gain circuit responsive to the DC signal of the rectification and average circuit for adjusting the gain of the variable gain circuit in response to the DC signal of the rectification and average circuit, the variable gain circuit having an input coupled to the output of the circuit and an output coupled to said second input of the operational amplifier circuit; and a bias circuit coupled to the rectification and average circuit and to the to variable gain circuit for providing a DC bias current to the variable gain circuit when the input signal is substantially equal to zero.

It is an advantage of the present invention to provide a DC bias current to a compressor circuit when an input signal to the compressor circuit is substantially equal to zero. It is also an advantage of the present invention to provide a DC feedback path from the output of a compressor circuit to the input of the compressor circuit with minimum external components.

The above and other features and advantages of the present invention will be better understood from the following detailed description taken in conjunction with the accompanying drawing.

BRIEF DESCRIPTION OF THE DRAWING

The sole FIGURE is a detailed schematic diagram illustrating a compressor circuit in accordance with the present invention.

DETAILED DESCRIPTION OF THE INVENTION

Referring to the sole FIG., a detailed schematic diagram illustrating a compressor circuit 10 comprising rectification and average circuit 12, variable gain stage 13, operational amplifier (op amp) 14, resistors 11 ($R_{IN}$), 15(R1) and 16 (R2) and bias circuit 17.

Rectification and average circuit 12 includes op amp 28 configured in a negative feedback mode having a non-inverting input coupled to a bias voltage, $V_B$, an inverting input coupled to circuit node 19 via resistor 15 (R1) wherein circuit node 19 is the input of rectification and average circuit 12. The inverting input of op amp 28 is also coupled to the emitter of transistor 20, to the base of transistor 21, and to the anode of diode 22. The output of op amp 28 is coupled to the base of transistor 20, to the emitter of transistor 21 and to the cathode of diode 22. Diode 22 may be formed by a transistor having its base and collector shorted together as is understood. The collector of transistor 20 is coupled to the collector of transistor 21 and to the base and collector of diode-connected transistor 23. The emitters of transistors 23 and 24 are coupled to a first supply voltage terminal at which the potential $V_{CC}$ is applied. Transistor 24 also has a base coupled to the base of transistor 23 and an emitter returned to ground reference through capacitor 25. It is understood that transistors 23 and 24 form a current mirror having an input at the collector of transistor 23 and an output at the collector of transistor 24. The collector of transistor 24 is further coupled through resistor 26 to circuit node 31. Op amp 27 has a non-inverting terminal coupled to bias voltage $V_B$, and an output coupled to the base of transistor 33. The inverting terminal of op amp 27 is coupled to circuit node 31 and to the emitter of transistor 33. The collector of transistor 33 is coupled to the base and collector of transistor 34. The emitters of transistors 34 and 35 are returned to ground reference. The base of transistor 35 is coupled to the base of transistor 34, and the collector of transistor 35 is coupled to circuit node 18 wherein circuit node 18 is the output of rectification and average circuit 12. It is understood that transistors 34 and 35 form a current mirror having an input at the collector of transistor 34 for receiving current $I_G/4$ and an output at the collector of transistor 35 for providing rectification current $I_{REC}$. Further, capacitor 25 and resistor 26 comprise an average circuit for averaging an AC signal appearing at the output of the collector of transistor 24 and providing a DC average current signal of $I_G/4$ which is proportional to the input voltage $V_{IN}$.

Variable gain stage 13 includes op amp 40 having a non-inverting input coupled to bias voltage $V_B$ and an output coupled to the bases of transistors 42 and 44. The inverting input of op amp 40 is coupled through current source 46 to operating potential $V_{CC}$. The inverting input of op amp 40 is also coupled to the base and collector of transistor 48 and through resistor 16 (R2) to circuit node 19. The emitters of transistors 42 and 48 are returned to ground reference through current source 50. Transistor 42 has a collector coupled to operating potential $V_{CC}$. Transistor 44 has a collector coupled to the collector of transistor 52 and to the inverting input of op amp 14. The base of transistor 52 is coupled to the base and collector of transistor 54 and to the collector of transistor 56. The emitters of transistors 52 and 54 are coupled to operating potential $V_{CC}$, and the base of transistor 56 is coupled to bias voltage $V_B$. The emitters of transistors 44 and 56 are coupled to circuit node 18.

Bias circuit 17 includes current source 60 which supplies current $I_{DC}$ and is coupled between operating potential $V_{CC}$ and the base and collector of transistor 62. The base of transistor 62 is also coupled to the bases of transistors 64 and 66. The emitters of transistors 62, 64 and 66 are all returned to ground reference. The collector of transistor 64 is coupled to circuit node 18 while the collector of transistor 66 is coupled to the bases of transistors 34 and 35 of rectification and average circuit 12.

In addition, compressor circuit 10 includes resistor 11 ($R_{IN}$) coupled between the inverting input of op amp 14 and input terminal 72 at which input voltage signal $V_{IN}$ is applied. Further, the output of op amp 14 is fed back to circuit node 19 and to output terminal 74 at which voltage signal $V_{OUT}$ is provided.

In operation, compressor circuit 10 is a variable gain amplifier which provides increasing gain as voltage input signal $V_{IN}$ decreases in amplitude, as is understood. For example, an input signal, having a 100 dB dynamic range, say from 0 dBV to −100 dBV, that undergoes a 2:1 compression, whereby every 2 dB change in input amplitude is compressed to a 1 dB change in output amplitude, results in the output signal having only a 50 dB dynamic range, say from −10 dBV to −60 dBV. In summary, as the level of the input signals increase, the overall gain of compressor circuit 10 decreases thereby compressing an input dynamic range signal to a smaller dynamic range output signal.

The operation of rectification and average circuit 12 is fully described in allowed U.S. patent application entitled "Full Wave Rectifier/Averaging Circuit" having Ser. No. 07/428,671, a filing date of Oct. 30, 1989 and assigned to the same assignee of the subject application, whereby the allowed aforementioned U.S. patent is incorporated by reference herein. Briefly, rectification and average circuit 12 receives a voltage signal at its input (circuit node 19) and provides a DC current, $I_{REC}$, which is used to set the gain of variable gain stage 13. It should be noted that the current mirror comprised of transistors 34 and 35 is designed to provide a current gain of, for example, four such that the output current ($I_{REC}$) is four times the input current ($I_G/4$).

Variable gain stage 13 receives signal $V_{OUT}$ at the base of transistor 48 via resistor R2. In a steady state condition, transistors 42 and 48 conduct currents substantially equal to $I_{REF}/2$ since current $I_{REF}$ of current source 50 is equally divided through transistors 42 and 48. Further, current source 46 provides current $I_1$ which is substantially equal to current $I_{REF}/2$. Further, transistors 44 and 56 conduct currents substantially equal to $I_G/2$ wherein current $I_G$ is provided by rectification and average circuit 12. As voltage $V_{OUT}$ increases, transistor 48 conducts more current than transistor 42 and op amp 40 responds to decrease the voltage at the bases of transistors 42 and 44 to compensate for the increase in voltage at the base of transistor 48. As a result, the voltage at the base of transistor 56 increases thereby increasing the current through transistor 56. This increased collector current of transistor 56 is subsequently mirrored through transistors 54 and 52 and supplied to the inverting input of op amp 14.

When voltage $V_{IN}$ is substantially equal to zero, that is, no input signal present, there is no DC feedback path from the output of op amp 14 to the inverting input of op amp 14. As a result, current $I_G/4$ is substantially equal to zero and transistor 34 is rendered non-operative. Further, there is no input current to be mirrored into transistor 35 and, thus, transistor 35 is also rendered non-operative. Thus, in a typical compressor, currents $I_G$ and $I_{REC}$ would be substantially equal to zero and, thus, variable gain stage 13 would no longer be biased. However, the present invention comprises bias circuit 17 which includes a current mirror circuit which has an input at the collector of transistor 62 for receiving current $I_{DC}$ from current current source 60 and a first output at the collector of transistor 64 for providing current $I_{DC}$ to variable gain stage 13. In addition, the current mirror circuit has a second output at the collector of transistor 66 for providing current $I_{DC}/4$ where the current gain between transistors 66 and 62 is, for example, four. Bias circuit 17 provides a constant bias current, $I_{DC}$, to variable gain stage 13 such that when there is no input signal, current $I_{DC}$ biases variable gain stage 13. Thus, when no input signal is present, current $I_G$ is substantially equal to current $I_{DC}$ and, thus, provides proper biasing for variable gain stage 13. In addition, current $I_{DC}/4$ is pulled from the base of transistor 35 thereby assuring that transistor 35 is rendered non-operative and allowing all of current $I_{DC}$ to bias variable gain stage 13.

On the other hand, when voltage $V_{IN}$ is not equal to zero, that is, there is an input signal present, it must be realized that current $I_{DC}$ does not introduce an error current into current $I_G$. This can be shown by first summing the currents at circuit node 18:

$$I_G = I_{DC} + I_{REC} \qquad (1)$$

Further, current $I_{REC}$ which is, for example, four times the current flowing into transistor 34, can be expressed as:

$$I_{REC}=4\times(I_G/4-I_{DC}/4)=I_G-I_{DC} \quad (2)$$

Upon substitution of the expression for $I_{REC}$ of Eqn. 2 into Eqn. 1, one obtains that $I_G=I_G$. Thus, when there is an input signal, bias current $I_{DC}$ has no effect on the value of current $I_G$. Intuitively, one should realize that since current $I_{DC}/4$ is pulled from the collector of transistor 34, and current $I_{DC}$ is pulled from the collector of transistor 35, current $I_{DC}$ is cancelled from current $I_G$ when the current mirrors (transistors 34 and 35, and transistors 62 and 66) have the proper current gain. A current mirror gain of four was used in the above description, but is not intended to be restricted to four. However, it should be realized that the current gain between transistors 34 and 35 should be substantially equal to the current gain between transistors 66 and 62 (or 64) so that an error current is not added to current $I_G$. In summary, bias circuit 17 provides current $I_{DC}$ such that when there is no input signal present, current $I_{DC}$ biases variable gain stage 13 thereby providing a DC feedback path form the output of op amp 14 to the inverting input of op amp 14. However, when there is an input signal present, current $I_{DC}$ does not affect the biasing of variable gain stage 13.

By now it should be appreciated that there has been provided a novel circuit that provides DC bias control of a compressor in the absence of an input signal while minimizing the number of external components and pins required. Further, the novel circuit does not affect the biasing of variable gain stage 13 when there is an input signal present.

What is claimed is:

1. A circuit responsive to an input signal applied at an input and providing an output signal at an output, comprising:
   an operational amplifier circuit having first and second inputs and an output, said first input being coupled to receive a bias voltage, said second input being coupled to the input of the circuit, and said output of said operational amplifier circuit being coupled to the output of the circuit;
   a rectification and average circuit for providing a DC signal at an output of said rectification and average circuit in response to the output signal, said rectification and average circuit having an input coupled to the output of the circuit;
   a variable gain circuit for adjusting the gain of said variable gain circuit in response to said DC signal of said rectification and average circuit, said variable gain circuit having an input coupled to the output of the circuit and an output coupled to said second input of said operational amplifier circuit; and
   a bias circuit coupled to said rectification and average circuit and to said variable gain circuit for providing a DC bias current to said variable gain circuit, said bias circuit including;
   a current source having first and second terminals, said first terminal being coupled to a first supply voltage terminal;
   a first transistor having a collector, a base and an emitter, said collector and said base being coupled to said second terminal of said current source, and said emitter being coupled to a second supply voltage terminal;
   a second transistor having a collector, a base and an emitter, said collector being coupled to said variable gain circuit, said base being coupled to said base of said first transistor, and said emitter being coupled to said second supply voltage terminal; and
   a third transistor having a collector, a base and an emitter, said collector being coupled to said rectification and average circuit, said base being coupled to said base of said first transistor, and said emitter being coupled to said second supply voltage terminal.

2. The circuit according to claim 1 further includes:
   an input resistor coupled between said second input of said operational amplifier circuit and the input of the circuit;
   a first resistor coupled between the output of the circuit and said input of said rectification and average circuit; and
   a second resistor coupled between the output of the circuit and said input of said variable gain circuit.

3. The circuit according to claim 2 wherein said variable gain circuit includes:
   a first current source having first and second terminals, said second terminal of said first current source of said variable gain circuit being coupled to said second supply voltage terminal;
   a second current source having first and second terminals, said first terminal of said second current source of said variable gain circuit being coupled to said first supply voltage terminal;
   a first transistor having a collector, a base and an emitter, said collector and said base of said first transistor of said variable gain circuit being coupled to said input of said variable gain circuit and to said second terminal of said second current source of said variable gain circuit, and said emitter of said first transistor of said variable gain circuit being coupled to said first terminal of said first current source of said variable gain circuit;
   a second transistor having a collector, a base and an emitter, said collector of said second transistor of said variable gain circuit being coupled to said first supply voltage terminal, and said emitter of said second transistor of said variable gain circuit being coupled to said emitter of said first transistor of said variable gain circuit;
   a third transistor having a collector, a base and an emitter, said collector of said third transistor of said variable gain circuit being coupled to said output of said variable gain circuit, said base of said third transistor of said variable gain circuit being coupled to said base of said second transistor of said variable gain circuit, and said emitter of said third transistor of said variable gain circuit being coupled to said bias circuit and to said output of said rectification and average circuit;
   a fourth transistor having a collector, a base and an emitter, said base of said fourth transistor of said variable gain circuit being coupled to said bias voltage, and said emitter of said fourth transistor of said variable gain circuit being coupled to said emitter of said third transistor of said variable gain circuit;
   a current mirror having an input and an output, said input of said current mirror being coupled to said collector of said fourth transistor of said variable gain circuit, and said output of said current mirror being coupled to said collector of said third transistor of said variable gain circuit; and an operational amplifier having first and second inputs and an output, said first input of said operational amplifier circuit of said variable gain circuit being coupled to said bias voltage, said second input of said operational amplifier circuit of said variable gain circuit being coupled to said collector of said first transistor of said variable gain circuit, and said output of said operational amplifier circuit of said variable gain circuit being coupled to said bases of said second and third transistors of said variable gain circuit.

4. The circuit according to claim 3 wherein said rectification and average circuit includes:

a first current mirror having an input and an output;

a second current mirror having an input and an output, said output of said second current mirror of said rectification and average circuit being coupled to said output of said rectification and average circuit;

a first operational amplifier circuit having first and second inputs and an output, said first input of said first operational amplifier circuit of said rectification and average circuit being coupled to said bias voltage;

a second operational amplifier circuit having first and second inputs and an output, said first input of said second operational amplifier circuit of said rectification and average circuit being coupled to said bias voltage, and said second input of said first operational amplifier circuit of said rectification and average circuit being coupled to said input of said rectification and average circuit;

a first transistor having a collector, a base and an emitter, said collector of said first transistor of said rectification and average circuit being coupled to said input of said first current mirror of said rectification and average circuit, and said base of said first transistor of said rectification and average circuit being coupled to said output of said first operational amplifier circuit of said rectification and average circuit;

a second transistor having a collector, a base and an emitter, said collector of said second transistor of said rectification and average circuit being coupled to said collector of said first transistor of said rectification and average circuit, said base of said second transistor of said rectification and average circuit being coupled to said emitter of said first transistor of said rectification and average circuit and to said second input of said first operational amplifier circuit of said rectification and average circuit, and said emitter of said second transistor of said rectification and average circuit being coupled to said output of said first operational amplifier circuit of said rectification and average circuit;

a third transistor having a collector, a base and an emitter, said collector being coupled to said input of said second current mirror of said rectification and average circuit, said base of said third transistor being coupled to said output of said second operational amplifier circuit of said rectification and average circuit, and said emitter of said third transistor of said rectification and average circuit being coupled to said second input of said second operational amplifier circuit of said rectification and average circuit;

a first resistor coupled between said output of said first current mirror of said rectification and average circuit and said emitter of said third transistor of said rectification and average circuit;

a capacitor coupled between said output of said first current mirror of said rectification and average circuit and said second supply voltage terminal; and a diode coupled between said base and emitter of said second transistor of said rectification and average circuit.

5. In a compandor, a compressor circuit responsive to an input signal applied at an input and providing an output signal at an output, comprising:

an operational amplifier circuit having first and second inputs and an output, said first input being coupled to receive a bias voltage, and said output of said operational amplifier circuit being coupled to the output of the circuit;

a rectification and average circuit for providing a DC signal at an output of said rectification and average circuit in response to the output signal applied at an input of said rectification and average circuit;

a variable gain circuit coupled to said output of said rectification and average circuit for adjusting the gain of said variable gain circuit in response to said DC signal of said rectification and average circuit, said variable gain circuit having an input and an output which coupled to said second input of said operational amplifier circuit;

a bias circuit coupled to said rectification and average circuit and to said variable gain circuit for providing a DC bias current to said variable gain circuit;

an input resistor coupled between said second input of said operational amplifier circuit and the input of the circuit;

a first resistor coupled between the output of the circuit and said input of said rectification and average circuit; and a second resistor coupled between the output of the circuit and said input of said variable gain circuit.

6. The circuit according to claim 5 wherein said DC bias circuit includes:

a current source having first and second terminals, said first terminal being coupled to a first supply voltage terminal;

a first transistor having a collector, a base and an emitter, said collector and said base being coupled to said second terminal of said current source, and said emitter being coupled to a second supply voltage terminal;

a second transistor having a collector, a base and an emitter, said collector being coupled to said variable gain circuit, said base being coupled to said base of said first transistor, and said emitter being coupled to said second supply voltage terminal; and a third transistor having a collector, a base and an emitter, said collector being coupled to said rectification and average circuit, said base being coupled to said base of said first transistor, and said emitter being coupled to said second supply voltage terminal.

7. The circuit according to claim 6 wherein said variable gain circuit includes:

a first current source having first and second terminals, said second terminal of said first current source of said variable gain circuit being coupled to said second supply voltage terminal;

a second current source having first and second terminals, said first terminal of said second current source of said variable gain circuit being coupled to said first supply voltage terminal;

a first transistor having a collector, a base and an emitter, said collector and said base of said first transistor of said variable gain circuit being coupled to said input of said variable gain circuit and to said second terminal of said second current source of said variable gain circuit, and said emitter of said first transistor of said variable gain circuit being coupled to said first terminal of said first current source of said variable gain circuit;

a second transistor having a collector, a base and an emitter, said collector of said second transistor of said variable gain circuit being coupled to said first supply voltage terminal, and said emitter of said second transistor of said variable gain circuit being coupled to said emitter of said first transistor of said variable gain circuit;

a third transistor having a collector, a base and an emitter, said collector of said third transistor of said variable gain circuit being coupled to said output of said variable gain circuit, said base of said third transistor of said variable gain circuit being coupled to said base of said second transistor of said variable gain circuit, and said emitter of said third transistor of said variable gain circuit being coupled to said bias circuit and to said output of said rectification and average circuit;

a fourth transistor having a collector, a base and an emitter, said base of said fourth transistor of said variable gain circuit being coupled to said bias voltage, and said emitter of said fourth transistor of said variable gain circuit being coupled to said emitter of said third transistor of said variable gain circuit;

a current mirror having an input and an output, said input of said current mirror being coupled to said collector of said fourth transistor of said variable gain circuit, and said output of said current mirror being coupled to said collector of said third transistor of said variable gain circuit; and an operational amplifier having first and second inputs and an output, said first input of said operational amplifier circuit of said variable gain circuit being coupled to said bias voltage, said second input of said operational amplifier circuit of said variable gain circuit being coupled to said collector of said first transistor of said variable gain circuit, and said output of said operational amplifier circuit of said variable gain circuit being coupled to said bases of said second and third transistors of said variable gain circuit.

8. The circuit according to claim 7 wherein said rectification and average circuit includes:

a first current mirror having an input and an output;

a second current mirror having an input and an output, said output of said second current mirror of said rectification and average circuit being coupled to said output of said rectification and average circuit;

a first operational amplifier circuit having first and second inputs and an output, said first input of said first operational amplifier circuit of said rectification and average circuit being coupled to said bias voltage;

a second operational amplifier circuit having first and second inputs and an output, said first input of said second operational amplifier circuit of said rectification and average circuit being coupled to said bias voltage, and said second input of said first operational amplifier circuit of said rectification and average circuit being coupled to said input of said rectification and average circuit;

a first transistor having a collector, a base and an emitter, said collector of said first transistor of said rectification and average circuit being coupled to said input of said first current mirror of said rectification and average circuit, and said base of said first transistor of said rectification and average circuit being coupled to said output of said first operational amplifier circuit of said rectification and average circuit;

a second transistor having a collector, a base and an emitter, said collector of said second transistor of said rectification and average circuit being coupled to said collector of said first transistor of said rectification and average circuit, said base of said second transistor of said rectification and average circuit being coupled to said emitter of said first transistor of said rectification and average circuit and to said second input of said first operational amplifier circuit of said rectification and average circuit, and said emitter of said second transistor of said rectification and average circuit being coupled to said output of said first operational amplifier circuit of said rectification and average circuit;

a third transistor having a collector, a base and an emitter, said collector being coupled to said input of said second current mirror of said rectification and average circuit, said base of said third transistor being coupled to said output of said second operational amplifier circuit of said rectification and average circuit, and said emitter of said third transistor of said rectification and average circuit being coupled to said second input of said second operational amplifier circuit of said rectification and average circuit;

a first resistor coupled between said output of said first current mirror of said rectification and average circuit and said emitter of said third transistor of said rectification and average circuit;

a capacitor coupled between said output of said first current mirror of said rectification and average circuit and said second supply voltage terminal; and a diode coupled between said base and emitter of said second transistor of said rectification and average circuit.

9. A circuit responsive to an input signal applied at an input and providing an output signal at an output, comprising:

an operational amplifier having first and second inputs and an output, said first input being coupled to receive a bias voltage, said second input being coupled to the input of the circuit, and said output of said operational amplifier being coupled to the output of the circuit;

first means for providing a DC signal at an output of said first means in response to the output signal, said first means having an input coupled to the output of the circuit;

second means responsive for adjusting the gain of said second means in response to said DC signal of said first means, said second means having an input coupled to the output of the circuit and an output coupled to said second input of said operational amplifier circuit; and third means coupled to said first means and to said second means for providing a DC bias current to said second means such that when the input signal is substantially equal to zero said second means is biased and provides a feedback path from the output to the input of the circuit said third means including:

a current source having first and second terminals, said first terminal being coupled to a first supply voltage terminal;

a first transistor having a collector, a base and an emitter, said collector and said base being coupled to said second terminal of said current source, and said emitter being coupled to a second supply voltage terminal;

a second transistor having a collector, a base and an emitter, said collector being coupled to said second means, said base being coupled to said base of said first transistor, and said emitter being coupled to said second supply voltage terminal; and a third transistor having a collector, a base and an emitter, said collector being coupled to said first means, said base being coupled to said base of said first transistor, and said emitter being coupled to said second supply voltage terminal.

10. The circuit according to claim 9 further includes:

an input resistor coupled between said second input of said operational amplifier and the input of the circuit;

a first resistor coupled between the output of the circuit and said input of said first means; and a second resistor coupled between the output of the circuit and said input of said second means.

11. The circuit according to claim 10 wherein said second means includes:

a first current source having first and second terminals, said second terminal of said first current source of said second means being coupled to said second supply voltage terminal;

a second current source having first and second terminals, said first terminal of said second current source of said second means being coupled to said first supply voltage terminal;

a first transistor having a collector, a base and an emitter, said collector and said base of said first transistor of said second means being coupled to said input of said second means and to said second terminal of said second current source of said second means, and said emitter of said first transistor of said second means being coupled to said first terminal of said first current source of said second means;

a second transistor having a collector, a base and an emitter, said collector of said second transistor of said second means being coupled to said first supply voltage terminal, and said emitter of said second transistor of said second means being coupled to said emitter of said first transistor of said second means;

a third transistor having a collector, a base and an emitter, said collector of said third transistor of said second means being coupled to said output of said second means, said base of said third transistor of said second means being coupled to said base of said second transistor of said second means, and said emitter of said third transistor of said second means being coupled to said bias circuit and to said output of said first means;

a fourth transistor having a collector, a base and an emitter, said base of said fourth transistor of said second means being coupled to said bias voltage, and said emitter of said fourth transistor of said second means being coupled to said emitter of said third transistor of said second means;

a current mirror having an input and an output, said input of said current mirror being coupled to said collector of said fourth transistor of said variable gain circuit, and said output of said current mirror being coupled to said collector of said third transistor of said second means; and an operational amplifier having first and second inputs and an output, said first input of said operational amplifier of said second means being coupled to said bias voltage, said second input of said operational amplifier of said second means being coupled to said collector of said first transistor of said second means, and said output of said operational amplifier of said second means being coupled to said bases of said second and third transistors of said second means.

12. A circuit responsive to an input signal applied at an input and providing an output signal at an output, comprising:

an operational amplifier circuit having first and second inputs and an output, said first input being coupled to receive a bias voltage, said second input being coupled to the input of the circuit, and said output of said operational amplifier circuit being coupled to the output of the circuit;

a rectification and average circuit for providing a DC signal at an output of said rectification and average circuit in response to the output signal, said rectification and average circuit having an input coupled to the output of the circuit;

a variable gain circuit having an adjusting gain in response to said DC signal of said rectification and average circuit, said variable gain circuit having an input coupled to the output of the circuit and an output coupled to said second input of said operational amplifier circuit; and a bias circuit coupled to said rectification and average circuit and to said variable gain circuit for providing a DC bias current to said variable gain circuit when the input signal is substantially equal to zero thereby providing a DC feedback path from said output of said variable gain circuit to said second input of said variable gain circuit, said DC bias current being substracted out and having negligible effect in the presence of a non-zero input signal.

13. The circuit according to claim 12 wherein said bias circuit includes:

a current source having first and second terminals, said first terminal being coupled to a first supply voltage terminal;

a first transistor having a collector, a base and an emitter, said collector and said base being coupled to said second terminal of said current source, and said emitter being coupled to a second supply voltage terminal;

a second transistor having a collector, a base and an emitter, said collector being coupled to said variable gain circuit, said base being coupled to said base of said first transistor, and said emitter being coupled to said second supply voltage terminal; and a third transistor having a collector, a base and an emitter, said collector being coupled to said rectification and average circuit, said base being coupled to said base of said first transistor, and said emitter being coupled to said second supply voltage terminal.

14. The circuit according to claim 13 further includes:
an input resistor coupled between said second input of said operational amplifier circuit and the input of the circuit;

a first resistor coupled between the output of the circuit and said input of said rectification and average circuit; and a second resistor coupled between the output of the circuit and said input of said variable gain circuit.

15. The circuit according to claim 14 wherein said variable gain circuit includes:
a first current source having first and second terminals, said second terminal of said first current source of said variable gain circuit being coupled to said second supply voltage terminal;

a second current source having first and second terminals, said first terminal of said second current source of said variable gain circuit being coupled to said first supply voltage terminal;

a first transistor having a collector, a base and an emitter, said collector and said base of said first transistor of said variable gain circuit being coupled to said input of said variable gain circuit and to said second terminal of said second current source of said variable gain circuit, and said emitter of said first transistor of said variable gain circuit being coupled to said first terminal of said first current source of said variable gain circuit;

a second transistor having a collector, a base and an emitter, said collector of said second transistor of said variable gain circuit being coupled to said first supply voltage terminal, and said emitter of said second transistor of said variable gain circuit being coupled to said emitter of said first transistor of said variable gain circuit;

a third transistor having a collector, a base and an emitter, said collector of said third transistor of said variable gain circuit being coupled to said output of said variable gain circuit, said base of said third transistor of said variable gain circuit being coupled to said base of said second transistor of said variable gain circuit, and said emitter of said third transistor of said variable gain circuit being coupled to said bias circuit and to said output of said rectification and average circuit;

a fourth transistor having a collector, a base and an emitter, said base of said fourth transistor of said variable gain circuit being coupled to said bias voltage, and said emitter of said fourth transistor of said variable gain circuit being coupled to said emitter of said third transistor of said variable gain circuit;

a current mirror having an input and an output, said input of said current mirror being coupled to said collector of said fourth transistor of said variable gain circuit, and said output of said current mirror being coupled to said collector of said third transistor of said variable gain circuit; and an operational amplifier having first and second inputs and an output, said first input of said operational amplifier circuit of said variable gain circuit being coupled to said bias voltage, said second input of said operational amplifier circuit of said variable gain circuit being coupled to said collector of said first transistor of said variable gain circuit, and said output of said operational amplifier circuit of said variable gain circuit being coupled to said bases of said second and third transistors of said variable gain circuit.

16. The circuit according to claim 15 wherein said rectification and average circuit includes:
a first current mirror having an input and an output;

a second current mirror having an input and an output, said output of said second current mirror of said rectification and average circuit being coupled to said output of said rectification and average circuit;

a first operational amplifier circuit having first and second inputs and an output, said first input of said first operational amplifier circuit of said rectification and average circuit being coupled to said bias voltage;

a second operational amplifier circuit having first and second inputs and an output, said first input of said second operational amplifier circuit of said rectification and average circuit being coupled to said bias voltage, and said second input of said first operational amplifier circuit of said rectification and average circuit being coupled to said input of said rectification and average circuit;

a first transistor having a collector, a base and an emitter, said collector of said first transistor of said rectification and average circuit being coupled to said input of said first current mirror of said rectification and average circuit, and said base of said first transistor of said rectification and average circuit being coupled to said output of said first operational amplifier circuit of said rectification and average circuit;

a second transistor having a collector, a base and an emitter, said collector of said second transistor of said rectification and average circuit being coupled to said collector of said first transistor of said rectification and average circuit, said base of said second transistor of said rectification and average circuit being coupled to said emitter of said first transistor of said rectification and average circuit and to said second input of said first operational amplifier circuit of said rectification and average circuit, and said emitter of said second transistor of said rectification and average circuit being coupled to said output of said first operational amplifier circuit of said rectification and average circuit;

a third transistor having a collector, a base and an emitter, said collector being coupled to said input of said second current mirror of said rectification and average circuit, said base of said third transistor being coupled to said output of said second operational amplifier circuit of said rectification and average circuit, and said emitter of said third transistor of said rectification and average circuit being coupled to said second input of said second operational amplifier circuit of said rectification and average circuit;
a first resistor coupled between said output of said first current mirror of said rectification and average circuit and said emitter of said third transistor of said rectification and average circuit;
a capacitor coupled between said output of said first current mirror of said rectification and average circuit and said second supply voltage terminal; and
a diode coupled between said base and emitter of said second transistor of said rectification and average circuit.

* * * * *